US012676544B2

(12) United States Patent (10) Patent No.: US 12,676,544 B2
Sun et al. (45) Date of Patent: Jul. 7, 2026

(54) CONSTANT POWER STARTUP FOR POWER CONVERTER

(71) Applicant: Murata Manufacturing Co., Ltd., Kyoto (JP)

(72) Inventors: Xiaowu Sun, Milford, NH (US); Gregory Szczeszynski, Nashua, NH (US)

(73) Assignee: Murata Manufacturing Co., Ltd., Kyoto (JP)

( * ) Notice: Subject to any disclaimer, the term of this patent is extended or adjusted under 35 U.S.C. 154(b) by 201 days.

(21) Appl. No.: 18/405,805

(22) Filed: Jan. 5, 2024

(65) Prior Publication Data

US 2025/0226740 A1 Jul. 10, 2025

(51) Int. Cl.
    *H02M 1/00* (2007.01)
    *H02M 1/08* (2006.01)
    *H02M 1/36* (2007.01)
    *H02M 3/07* (2006.01)
    *H03K 17/082* (2006.01)

(52) U.S. Cl.
    CPC ........... *H02M 1/08* (2013.01); *H02M 1/0025* (2021.05); *H02M 1/36* (2013.01); *H02M 3/07* (2013.01); *H03K 17/0822* (2013.01)

(58) Field of Classification Search
    CPC ........ H02M 1/00; H02M 1/08; H02M 1/0003; H02M 1/0006; H02M 1/0025; H02M 1/0019; H02M 1/0038; H02M 3/07; H02M 3/157; H03K 17/00; H03K 17/04; H03K 17/041; H03K 17/04106; H03K 17/08

USPC ......................... 327/108, 109, 110, 111, 112
See application file for complete search history.

(56) References Cited

U.S. PATENT DOCUMENTS

| | | | |
|---|---|---|---|
| 8,503,203 | B1 | 8/2013 | Szczeszynski et al. |
| 9,203,299 | B2 | 12/2015 | Low et al. |
| 10,199,928 | B1 | 2/2019 | Wiedenbauer et al. |
| 10,263,514 | B1 | 4/2019 | Aboueldahab |
| 10,680,512 | B2 | 6/2020 | Babazadeh et al. |
| 10,958,166 | B1 | 3/2021 | Low |
| 10,992,226 | B1 | 4/2021 | Aboueldahab et al. |
| 11,146,173 | B1 | 10/2021 | Ramos |
| 11,482,931 | B2 | 10/2022 | Routledge |
| 11,502,597 | B2 | 11/2022 | Rainer et al. |

(Continued)

FOREIGN PATENT DOCUMENTS

CN         116345854 A    6/2023

*Primary Examiner* — Hai L Nguyen
(74) *Attorney, Agent, or Firm* — Haynes and Boone, LLP

(57) ABSTRACT

Circuits and methods for providing a constant, limited power to a transistor of a power converter during a startup period while achieving high efficiency and high performance. In a first embodiment, a driver circuit includes a variable reference current circuit configured to provide a first current inversely proportional to a voltage across the transistor, and a coupled power limiting circuit that enables a second current through the transistor that is proportional to the first current. In a second embodiment, a driver circuit includes a variable reference current circuit configured to provide a first current that increases over a time period of operation as a function of a voltage at a node of the power converter, and a coupled power limiting circuit that enables a second current through the transistor that is proportional to the first current and inversely proportional to a voltage across the transistor.

22 Claims, 6 Drawing Sheets

(56) References Cited

U.S. PATENT DOCUMENTS

| | | | | |
|---|---|---|---|---|
| 11,942,860 | B2 | 3/2024 | Routledge | |
| 12,184,174 | B2 * | 12/2024 | Routledge | H02M 1/08 |
| 12,341,501 | B2 * | 6/2025 | Vangara | H03K 5/086 |
| 2012/0120688 | A1 | 5/2012 | Hoon et al. | |
| 2021/0408905 | A1 | 12/2021 | Li | |

* cited by examiner

CONSTANT POWER STARTUP FOR POWER CONVERTER

BACKGROUND

(1) Technical Field

This invention relates to electronic circuits, and more particularly to power converter circuits, including DC-DC converter circuits, and current limiting circuits for startup of such converter circuits.

(2) Background

Many electronic products, particularly mobile computing and/or communication products and components (e.g., notebook computers, ultra-book computers, tablet devices, LCD and LED displays) require multiple voltage levels. For example, radio frequency (RF) transmitter power amplifiers may require relatively high voltages (e.g., 12V or more), whereas logic circuitry may require a low voltage level (e.g., 1-2V). Still other circuitry may require an intermediate voltage level (e.g., 5-10V).

Power converters are often used to generate a lower or higher voltage from a common power source, such as a battery. One type of power converter comprises a converter circuit (e.g., a charge pump based on a switch-capacitor network), control circuitry, and, in some embodiments, auxiliary circuitry such as bias voltage generator(s), a clock generator, a voltage regulator, a voltage control circuit, etc. As used in this disclosure, the term "charge pump" refers to a switched-capacitor network configured to boost or buck an input voltage $V_{IN}$ to an output voltage $V_{OUT}$. Examples of such charge pumps include cascade multiplier, Dickson, Ladder, Series-Parallel, Fibonacci, and Doubler switched-capacitor networks, all of which may be configured as a multi-phase or a single-phase network. Switched-capacitor network DC-DC converters are generally integrated circuits (ICs) that may have some external components (such as capacitors) and in many cases are characterized as having a fixed $V_{IN}$ to $V_{OUT}$ conversion ratio (e.g., division by 2 or by 3). As is known in the art, an AC-DC power converter can be built up from a DC-DC power converter by, for example, first rectifying an AC input to a DC voltage and then applying the DC voltage to a DC-DC power converter.

To provide greater flexibility to system designers, and to deal with applications where a power source may change that requires different conversion ratios (e.g., as a battery discharges and outputs a lower voltage, or when the power source to a device is switched between a battery and an AC-DC power line source), it is useful to utilize a DC-DC power converter having a selectable conversion ratio. For example, U.S. Pat. No. 10,263,514 B1, issued Apr. 16, 2019, entitled "Selectable Conversion Ratio DC-DC Converter", assigned to the assignee of the present invention and hereby incorporated by this reference, describes a Dickson DC-DC power converter that may be switched between a divide-by-2 (DIV2) mode of operation and a divide-by-3 (DIV3) mode of operation. As another example, U.S. Pat. No. 9,203,299 B2, issued Dec. 1, 2015, entitled "Controller-Driven Reconfiguration of Switched-Capacitor Power Converter", now assigned to the assignee of the present invention and hereby incorporated by this reference, describes other DC-DC power converter architectures having reconfigurable conversion ratios.

A general problem with many FET-based DC-DC power converter architectures is that excessive current in-rush needs to be avoided during startup of the power converter. For example, for a selectable conversion ratio DC-DC converter of the type shown in U.S. Pat. No. 10,263,514 B1, absent sufficient guard circuitry, when an input voltage $V_{IN}$ is first applied, $V_{OUT}$ would be at zero volts and none of the capacitors (sometimes known as "fly capacitors") would be charged initially, and accordingly current rushes into the circuit. For instance, if the ON resistance, $R_{ON}$, of the FET power switches is 1 milliohm (0.001 ohms), and $V_{IN}$ is 10V, then as a result of Ohm's law ($V=I\times R$), the in-rush current will be a spike of about 10,000 amps. In integrated circuit implementations, parasitic inductances exist (for example, due to on-die conductor routing and printed circuit board conductor routing) which transform a current spike to a voltage spike in accordance with inductor theory ($V=L\times dI/dt$). Such voltage spikes electrically overstress the charge pump power switches, affecting their reliability, potentially to destruction. For a 1ns 100 A pulse to generate 10V across the charge pump power switches, the parasitic inductance need only be about 100 pH. The resulting 10V spike may exceed the breakdown voltage of many of the FET switches, and of course, a larger current spike results in a larger voltage spike for the same parasitic inductance.

A related problem occurs when the fly capacitors of a DC-DC power converter are out of balance, meaning that a charge difference exists between fly capacitors connected by power switches. If charge balance is not maintained, current spikes and resulting damaging voltage spikes can occur.

A further design challenge is attaining (1) quick startup without overheating and (2) high efficiency, especially important for devices (e.g., cell phones, "smart" watches, and fitness wearables) having constrained battery space.

Accordingly, it would be useful to be able to mitigate or eliminate what may be characterized as "potentially damaging events" in power converters (e.g., damaging current spikes that may occur for a variety of reasons, including in-rush current, charge transfer current, short circuits, EMI events, and the like) while achieving high efficiency and high performance.

SUMMARY

The present invention encompasses circuits and methods for providing a constant, limited power to a power converter during startup while achieving high efficiency and high performance (quicker startup time without overheating).

Embodiments include driver circuits for maintaining approximately constant power through a transistor of a power converter during a time period of operation of the power converter. The first embodiment of such a driver circuit includes a variable reference current circuit configured to provide a first current that is inversely proportional to a voltage across the transistor, and a power limiting circuit coupled to the variable reference current circuit and to a control input of the transistor, wherein the power limiting circuit enables a second current through the transistor that is proportional to the first current.

A second embodiment of such a driver circuit includes a variable reference current circuit configured to provide a first current that increases over a time period of operation as a function of a voltage at a node of the power converter, and a power limiting circuit coupled to the variable reference current circuit and to a control input of the transistor, wherein the power limiting circuit enables a second current through the transistor that is proportional to the first current and inversely proportional to a voltage across the transistor.

Another aspect of the invention is a method of maintaining approximately constant power through a transistor of a power converter during a time period of operation of the power converter by limiting current through the transistor to a value that is inversely proportional to a voltage across the transistor. Yet another aspect of the invention is a method of maintaining approximately constant power through a FET of a power converter during a startup time period of operation of the power converter by limiting current through the FET to a value that is inversely proportional to a drain-to-source voltage $V_{DS}$ across the FET.

The details of one or more embodiments of the invention are set forth in the accompanying drawings and the description below. Other features, objects, and advantages of the invention should be apparent from the description and drawings, and from the claims.

DESCRIPTION OF THE DRAWINGS

Like reference numbers and designations in the various drawings indicate like elements unless the context requires otherwise.

DETAILED DESCRIPTION

Figure 1:
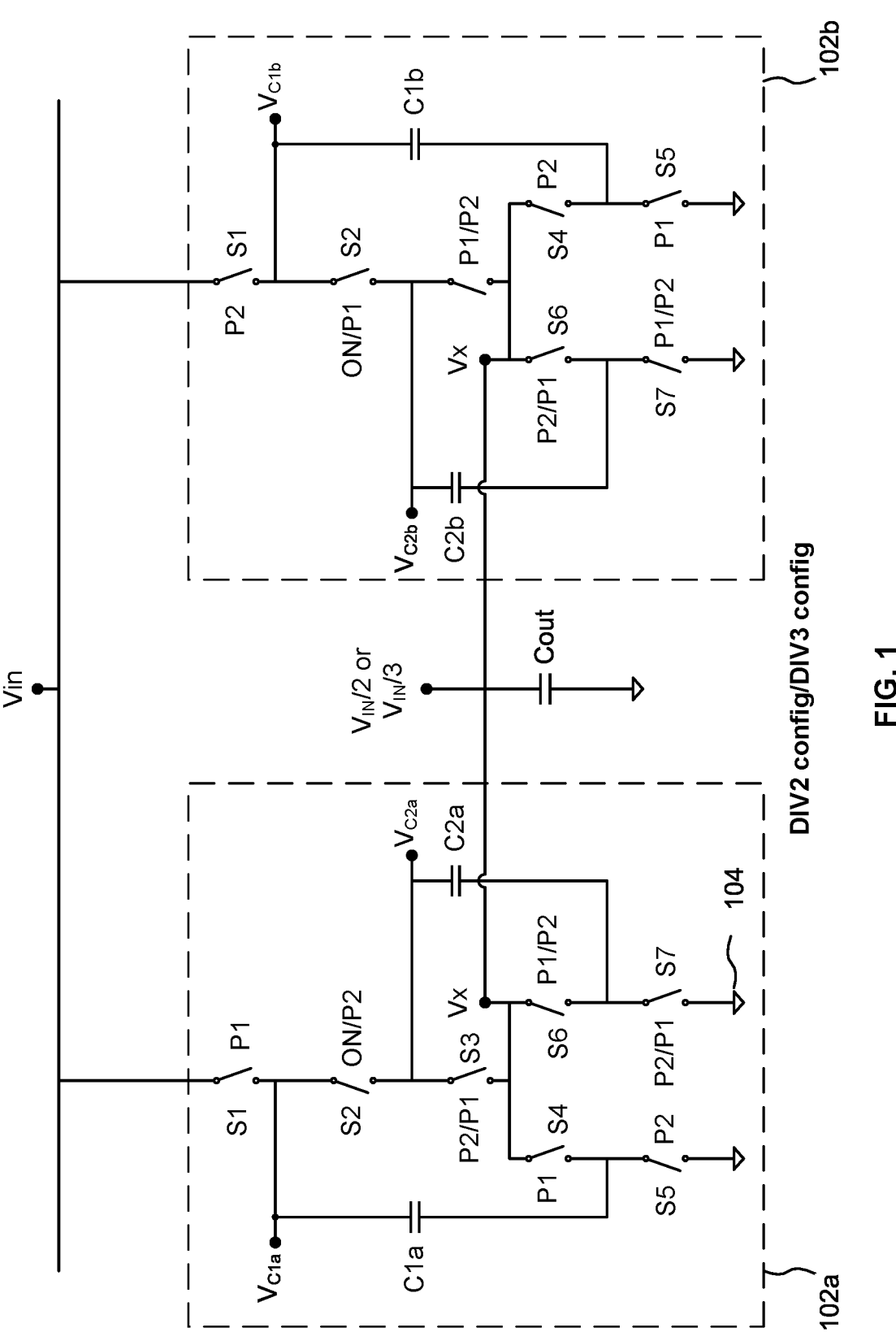
FIG. 1 is a block diagram of one embodiment of a DC-DC selectable conversion ratio power converter.

The present invention encompasses circuits and methods for providing a constant, limited power to a power converter during startup while achieving high efficiency and high performance (quicker startup time without overheating). Example Selectable Conversion Ratio Power Converter As one example of a power converter, FIG. 1 is a block diagram of one embodiment of a DC-DC selectable conversion ratio power converter 100. The specific illustrated power converter 100 may be selectably configured to be either a divide-by-2 (DIV2) Dickson converter or a divide-by-3 (DIV3) Dickson converter using the same basic circuit. The same power converter 100 may be used in general for DC-to-DC boost conversion by reversing the voltage input and voltage output, possibly with some relatively minor design changes. The illustrated power converter 100 includes two parallel sections 102a, 102b that are coupled between a voltage source $V_{IN}$ and a reference potential 104 such as circuit ground. Each section 102a, 102b includes 3 series-connected switches S1-S3 coupled in series to a first branch comprising 2 series-connected switches S4-S5, and to a second branch comprising 2 series-connected switches S6-S7. Each switch may comprise, for example, one or more FETs, including one or more MOSFETs.

In each section 102a, 102b, coupled between a first upper pair of switches S1, S2 and a first branch pair of switches S4, S5 is a first fly capacitor C1a, C1b, and coupled between a second upper pair of switches S2, S3 and a second branch pair of switches S6, S7 is a second fly capacitor C2a, C2b. The first fly capacitors C1a, C1b, when charged, have a voltage of $V_{IN}/2$ across them at respective nodes $V_{C1a}$ and $V_{C1b}$. The second fly capacitors C2a, C2b, when charged, have a voltage of either $V_{IN}/2$ (DIV/2) or $V_{IN}/3$ (DIV/3) across them at respective nodes $V_{C2a}$ and $V_{C2b}$. Depending on the output ratio configuration (divide-by-2 or divide-by-3), each section 102a, 102b may generate an output voltage at a node $V_X$ that is coupled to an output capacitor $C_{OUT}$.

At least some of the switches S1-S7 may be selectively controlled to be in an ON (conductive) or OFF (blocking) state by control circuitry (not shown). At least some of the switches S1-S7 may be selectively coupled to one of two non-overlapping complementary clock phases, P1 or P2. Some of the switches S1-S7 may be permanently coupled to one of the two complementary clock phases, P1 or P2. TABLE 1 below shows the configuration of the state or associated clock phase for each of the switches S1-S7 of the two parallel sections 102a, 102b for both a divide-by-2 configuration and a divide-by-3 configuration.

TABLE 1

| Divide-by-2 Configuration | | Divide-by-3 Configuration | |
|---|---|---|---|
| Section 102a | Section 102b | Section 102a | Section 102b |
| S1 = P1 | S1 = P2 | S1 = P1 | S1 = P2 |
| S2 = ON | S2 = ON | S2 = P2 | S2 = P1 |
| S3 = P2 | S3 = P1 | S3 = P1 | S3 = P2 |
| S4 = P1 | S4 = P2 | S4 = P1 | S4 = P2 |
| S5 = P2 | S5 = P1 | S5 = P2 | S5 = P1 |
| S6 = P1 | S6 = P2 | S6 = P2 | S6 = P1 |
| S7 = P2 | S7 = P1 | S7 = P1 | S7 = P2 |

The clock phase associations for section 102b are the complements of the clock phase associations for section 102a. The complementary phasing of the two parallel sections 102a, 102b provides output ripple smoothing, more constant output drive current, and additional current capacity. Additional sections may be included to provide even more current capacity. Complimentary pairs of additional sections may be controlled by clock signal phases that are 180° apart and that have a different phase than P1 or P2 to provide even more output ripple smoothing (e.g., 45° or 60°—or multiples of those values—out of phase with respect to P1 and P2).

Figure 2:
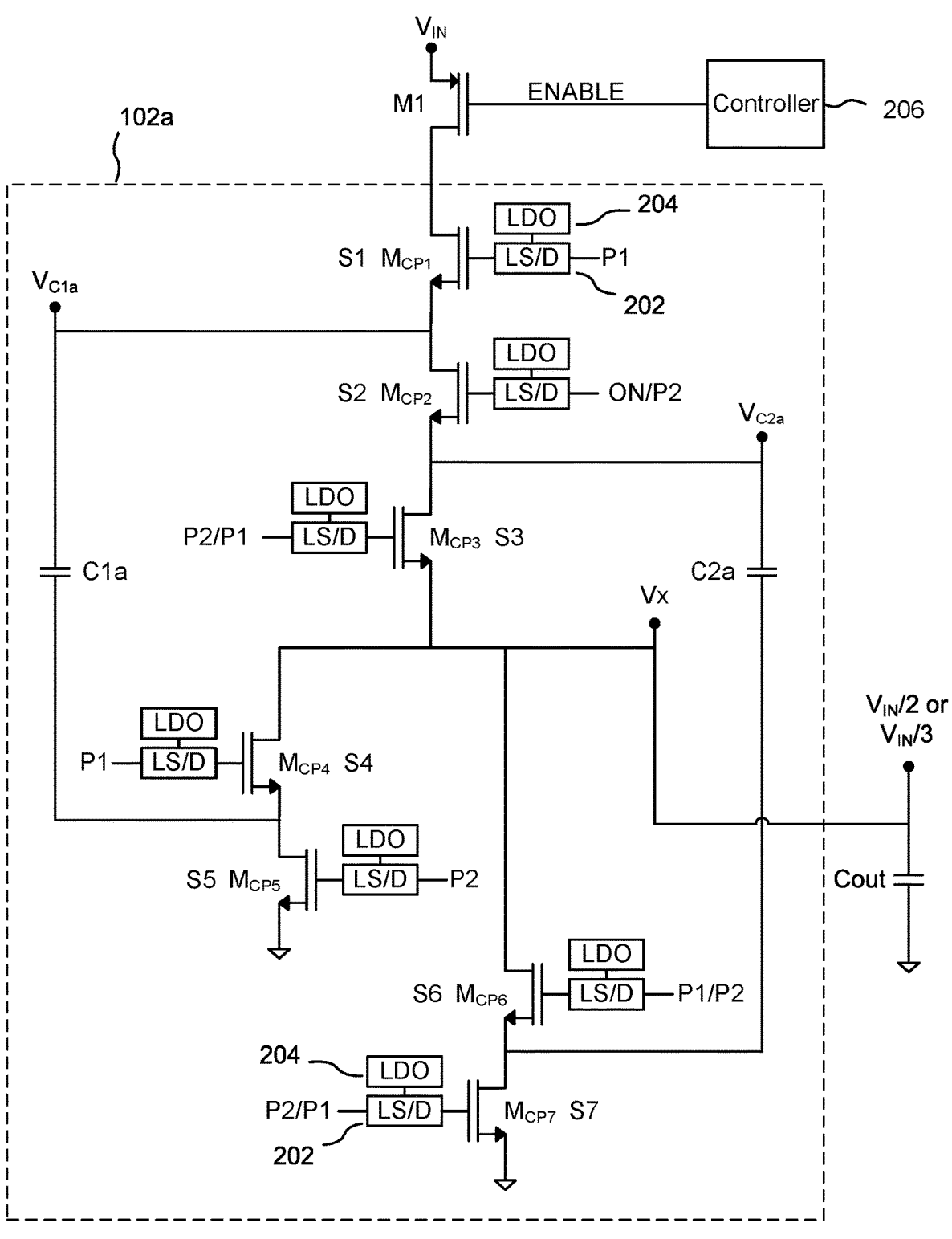
FIG. 2 is a schematic diagram of one section of the power converter of FIG. 1 showing details of a FET implementation of the power switches S1-S7 of that section.

In a FET-based implementation, ON/OFF control signals or clock phase signals are coupled to the gate of each switch S1-S7 through at least a driver circuit, and in many cases through both a level shifter circuit and a driver circuit (see FIG. 2 for more details).

In either configuration, the non-overlapping complementary clock signals P1, P2 open or close associated power switches, causing charge to be transferred from the fly capacitors C1a, C1b, C2a, C2b into the output capacitor $C_{OUT}$, resulting in a voltage across $C_{OUT}$ of $V_{IN}/x$, where x=2 or 3. Further details of the operation of this and similar DC-DC selectable conversion ratio power converters are set forth in U.S. Pat. No. 10,263,514 B1.
Limiting In-Rush Current During Start-Ups As noted above, damaging current spikes in power converters may occur for a variety of reasons, including in-rush current, charge transfer current, short circuits, and the like. For example, with respect to DC-DC power converters having selectable conversion ratios, switching from one conversion ratio (e.g., DIV2) to another conversion ratio (e.g., DIV3) may result in a charge imbalance across the fly capacitors, resulting in potentially damaging in-rush currents. Accordingly, a common practice for avoiding potentially damaging events has been to switch the DC-DC power converter OFF, allow the fly capacitors to fully discharge, change the conversion ratio configuration (e.g., by changing clock phasing to the switches S1-S7 as needed), and turn the power back ON, relying on conventional startup circuitry to mitigate in-rush current spikes. A disadvantage of this practice is that the process can take several milliseconds to complete and cannot be completed under load. In any kind of power converter, in-rush current spikes may occur during a transition from OFF to ON.

One aspect of the present invention encompasses circuits and method for mitigating or eliminating potentially damaging events if they occur or are to occur (e.g., are known in advance, as when a conversion ratio is to be dynamically changed).

FIG. 2 is a schematic diagram of one section 102a of the power converter 100 of FIG. 1 showing details of a FET implementation of the power switches S1-S7 of that section. While section 102a is shown, a similar configuration exists for section 102b. In the illustrated example, power switches S1-S7 are implemented as FETs $M_{CP1}$-$M_{CP7}$ (generically, "$M_{CPx}$"). The gate of each FET $M_{CPx}$ is coupled to a level-shifter/driver block 202 (not all instances are numbered to avoid clutter). In some cases (e.g., power switches S6 and S7), the level-shifter/driver block 202 may include only a driver, as level shifting may not be needed, depending upon the $V_{IN}$ and $V_{OUT}$ voltages. A level shifter translates an input signal from one voltage domain (e.g., digital logic voltages) to another voltage domain (e.g., transistor control voltages). The output of the level shifter thus follows the input signal but in a different voltage range. Power to each level-shifter/driver block 202 is provided by a corresponding low-dropout voltage regulator (LDO) block 204. A clock phase (P1 or P2 in this example) or an ON/OFF control signal may be coupled through a level-shifter/driver block 202 to the gate of the corresponding power FET $M_{CPx}$.

In some embodiments, a high-voltage main switch M1 controlled by an ENABLE signal (e.g., from a controller 206) may be inserted between $V_{IN}$ and the power converter section 102a. Section 102a is OFF when M1 is open (non-conducting) and is ON when M1 is closed (conducting).

U.S. patent application Ser. No. 17/331,594, filed May 26, 2021, entitled "Dynamic Division Ratio Charge Pump Switching", and U.S. patent application Ser. No. 17/960,712, filed Oct. 5, 2022, entitled "Reduced Gate Drive for Power Converter with Dynamically Switching Ratio" (both assigned to the assignee of the present invention, the contents of both of which are incorporated by reference) describe that at least some of the LDO blocks 204 can selectively increase $R_{ON}$ for an associated power FET in a power converter by actively controlling the driver voltage to the gate of the power FET. During normal power converter operation, the power FET driver voltage may be set to overdrive the FET gate to lower $R_{ON}$ to a desired level that allows high current flow for a particular application. For other scenarios (e.g., during soft-startup, charge balancing, or conversion ratio mode changes), the power FET driver voltage may be reduced so as to increase $R_{ON}$ and thus impede current flow through the power FET to a desired level.

While beneficial in many aspects, the disclosed reduced gate driver circuits can be improved upon in terms of reduced circuit area and faster startup time. The present disclosure teaches a circuit that provides constant, limited power to at least the principal transistor device of a power converter during startup while achieving high efficiency and quick startup times without overheating.

EXAMPLE EMBODIMENT

Figure 3:
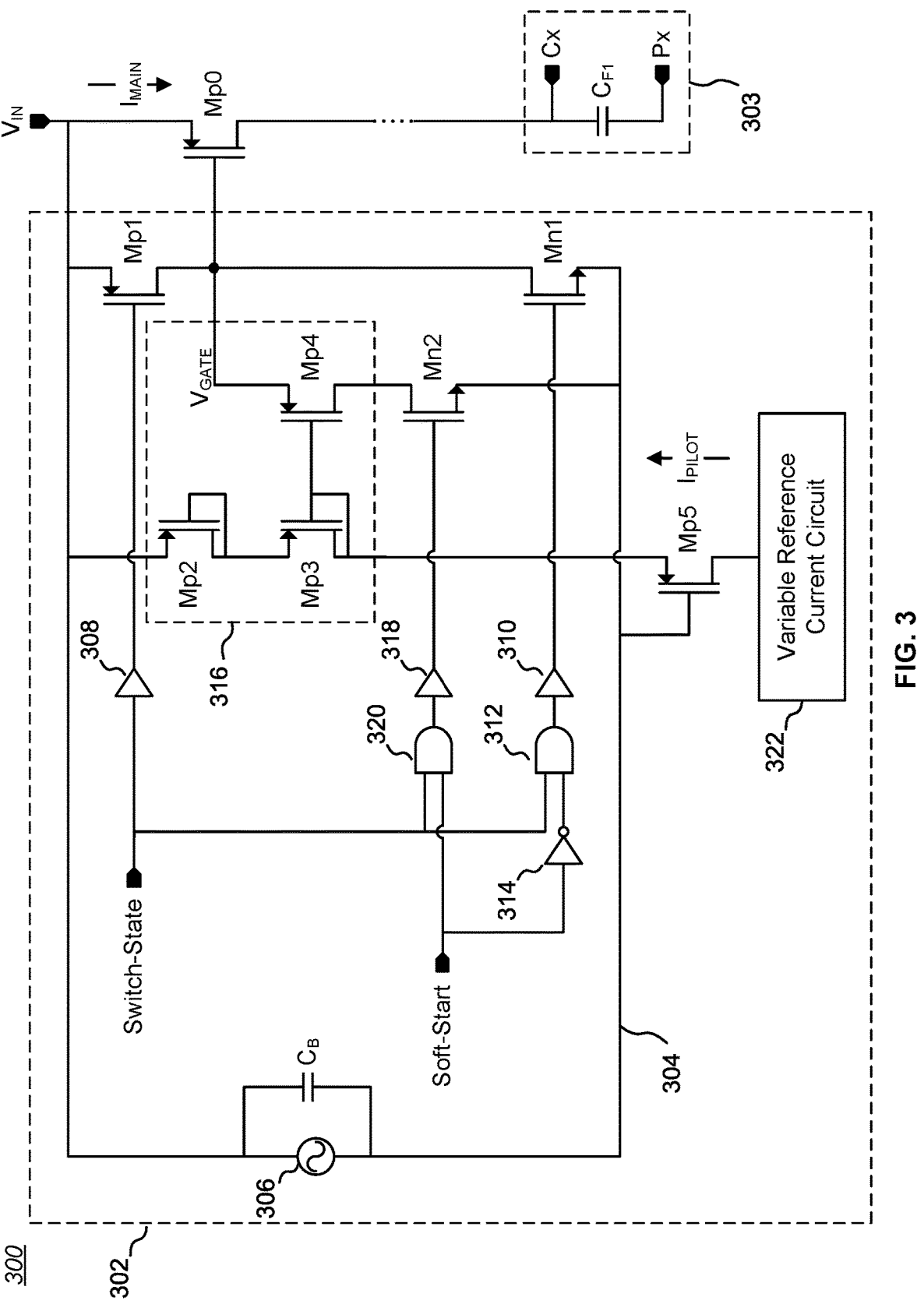
FIG. 3 is a schematic diagram of an example embodiment of the present invention.

FIG. 3 is a schematic diagram of an example embodiment 300 of the present invention. A dashed box surrounds a gate voltage driver (GVD) circuit 302 that would be coupled to the gate of the initial FET within a power converter (or a section of the power converter) that is closest to the $V_{IN}$ input. The initial FET may be, for example, FET M1 in FIG. 2 (if present) or the switches S1 in sections 102a, 102b in FIG. 1 (if FET M1 is not present); see also FIG. 5 below showing an example of the connection of a GVD circuit 302 in a step-up power converter.

In FIG. 3, the GVD circuit 302 is shown as coupled to the gate of a pFET Mp0; however, the circuitry shown in FIG. 3 may be readily adapted for the case in which FET Mp0 is an nFET. The conduction channel (source-to-drain) of pFET Mp0 is coupled between an input voltage source $V_{IN}$ and a first fly capacitor $C_{F1}$, which may be coupled to pFET Mp0 directly or through intervening closed switches (not shown in FIG. 3). Fly capacitor $C_{F1}$ may correspond, as one example, to fly capacitor C1a or fly capacitor C1b in FIG. 1. In the illustrated example, the fly capacitor $C_{F1}$ is shown as being part of a power converter circuit block 303. Node Px indicates a connection point from fly capacitor $C_{F1}$ to other components within the power converter circuit block 303 (e.g., to the node between switches S4 and S5 in FIG. 1). Node Cx indicates a connection point to fly capacitor $C_{F1}$; a voltage across fly capacitor $C_{F1}$ may be measured between nodes Cx and Px.

The function of the GVD circuit 302 is to control the gate voltage of at least the initial power converter FET to provide approximately constant power (as opposed to constant voltage or constant current) to charge the power converter fly capacitors at startup. In a preferred embodiment, the GVD circuit 302 controls the gate voltage of only the initial power converter FET so as to charge fly capacitor $C_{F1}$; the remaining switches within the power converter may be driven at full strength to charge other fly capacitors (if any). Providing constant power through the initial pFET Mp0 prevents the power converter circuitry—typically embodied in an integrated circuit (IC)—from overheating and enables quicker startup time.

As noted above, at startup of a power converter (the output voltage $V_{OUT}$ and all fly capacitors start at 0V. For a step-down power converter, the drain-to-source voltage $V_{DS}$ of the initial FET starts at $V_{IN}$ (which may be, for example, 100V) and gradually reduces as the fly capacitors charge, such that, at full charge, the $V_{DS}$ of the initial FET is approximately equal to $V_{IN}-(n \times V_{OUT})$, where n is the conversion ratio of the power converter (e.g., n=2 for a divide-by-2 converter and n=3 for a divide-by-3 converter). The soft-start current within a power converter is controlled by the initial FET coupled to $V_{IN}$, meaning that the main power loss in a power converter circuit during soft-startup occurs within that initial FET (if no high-voltage main switch M1 is used, such as in the dual-phase power converter shown in FIG. 1, then the main power loss during soft-startup occurs within the top two FET switches S1 in sections 102a, 102b). Accordingly, control of the soft-start current is of importance in maintaining the power consumption of a power converter approximately constant during that phase of operation.

To maintain an approximately constant power loss in the initial FET (or FETs) during soft-startup, embodiments of the present invention control the current flow through the initial FET to be approximately inversely proportional to $V_{IN}-(n \times V_{OUT})$ as the output voltage $V_{OUT}$ and the charge on all fly capacitors reach steady state values. The current flow through the initial FET is controlled by regulating the gate voltage of the initial FET, in essence dynamically varying the $R_{ON}$ of the initial FET over a range of values during soft-startup.

The GVD circuit 302 includes both control circuitry and power limiting circuitry. In greater detail, the conduction channel of a pFET Mp1 is coupled between $V_{IN}$ and the gate of pFET Mp0, while the conduction channel of an nFET Mn1 is coupled between the gate of pFET Mp0 and a negative floating reference potential 304 set by a regulator circuit 306, shown coupled in parallel with a boot capacitor $C_B$. The regulator circuit 306 provides a local voltage range (e.g., 5V) for the devices in the GVD circuit 302, even if $V_{IN}$ is much higher (e.g., 100V). The gate of pFET Mp1 is coupled through a buffer 308 to a Switch-State signal line from a controller (not shown). The gate of nFET Mn1 is coupled through a buffer 310 to a first AND gate 312, a first input of which is coupled to the Switch-State signal line. A second input of the first AND gate 312 is coupled through an inverter 314 to a Soft-Start control line from the controller.

The conduction channel of an nFET Mn2 is coupled between a power limiting circuit 316 and the negative floating reference potential 304. The gate of nFET Mn2 is coupled through a buffer 318 to a second AND gate 320, a first input of which is coupled to the Switch-State signal line and a second input of which is coupled to the Soft-Start control line.

The Switch-State signal line and the Soft-Start control line set the states of FETs Mp1, Mn1, and Mn2, which function as ON/OFF switches controlling the operation state of the GVD circuit 302, and in particular of the power limiting circuit 316. During normal post-startup operation, the Switch-State signal line also controls the OPEN/CLOSED state of the pFET Mp0.

If Switch-State=0, then FETs Mn1 and Mn2 are OFF (non-conducting) and FET Mp1 is ON (conducting, since $V_{GS}$ of Mp1 is negative). Accordingly, the gate voltage $V_{GATE}$ to pFET Mp0 is approximately equal to $V_{IN}$ (through FET Mp1) and thus pFET Mp0 is strongly pulled-up and set to an OFF state, blocking charge flow through to the power converter circuit block 303.

If Switch-State=1 and Soft-Start=0, then FET Mn1 is ON and FETs Mn2 and Mp1 are OFF (since $V_{GS}$ of Mp1 is non-negative). Accordingly, the gate voltage $V_{GATE}$ to pFET Mp0 is approximately equal to the negative floating reference potential 304 (through FET Mn1) and thus pFET Mp0 is strongly pulled-down and set to an ON state. Since FET Mn2 is also OFF, the power limiting circuit 316 is non-operational. This state corresponds to pFET Mp0 being fully ON for normal, non-startup operation.

If Switch-State=1 and Soft-Start=1, then FETs Mn1 and Mp1 are OFF and FET Mn2 is ON. Accordingly, the pull-up function of pFET Mp1 and the pull-down function of nFET Mn1 are disabled, and the power limiting circuit 316 is operational (enabled) and controls the gate voltage $V_{GATE}$ to pFET Mp0.

The power limiting circuit 316 includes diode-connected pFETs Mp2 and Mp3. A first terminal of the conduction channel of pFET Mp2 is coupled to $V_{IN}$ and a second terminal of the conduction channel of pFET Mp2 is coupled to a first terminal of the conduction channel of pFET Mp3; accordingly, the conduction channels of pFETs Mp2 and Mp3 are connected in series. The gate of pFET Mp3 is coupled to the gate of a pFET Mp4 and to a second terminal of pFET Mp3. The conduction channel of pFET Mp4 is coupled between the gate of pFET Mp0 and the conduction channel of switch FET Mn2 (and thus is switchably connectable to the negative floating reference potential 304).

The second terminal of the conduction channel of pFET Mp3 is also coupled to the conduction channel of a cascode pFET Mp5, which in turn is coupled to the variable reference current circuit 322. The gate of pFET Mp5 is coupled to the negative floating reference potential 304 in this example. In many applications, pFET Mp5 would typically be a high-voltage device and may be necessary to protect lower voltage devices within the variable reference current circuit 322. Note that pFET Mp5 may not be needed for a step-up power converter, since the input voltage may be sufficiently low that its protective function is not needed.

The variable reference current circuit 322 generates a pilot current $I_{PILOT}$ that flows through pFETs Mp3 and Mp2 when the power limiting circuit 316 is operational (i.e., when switch Mn2 is closed). The pFET Mp2 sets the gate voltage on pFET Mp4 as a function of the pilot current $I_{PILOT}$. When the power limiting circuit 316 is operational, pFETs Mp3 and Mp4 function as a pull-down buffer to quickly set the gate voltage $V_{GATE}$ for MP0 in response to the Mp4 gate voltage set by pFET Mp2.

pFET Mp0 functions as a current mirror with respect to power limiting circuit 316, such that the current $I_{MAIN}$ through pFET Mp0 is proportional to m times the pilot current $I_{PILOT}$ flowing through the power limiting circuit 316, where m is the ratio of device sizes between pFET Mp0 and pFET Mp2; as one example, m may be 100 in a particular implementation of the power limiting circuit 316. Controlling the gate voltage $V_{GATE}$ for MP0 limits the current available to charge fly capacitor $C_{F1}$, and consequently limits the current available to charge all other fly capacitors.

The power $P_{MAIN}$ through pFET Mp0 is time-varying and proportional to its $V_{DS} \times I_{MAIN}$. The drain-to-source voltage of $V_{DS}$ of pFET Mp0 is approximately equal to $V_{IN}-(n \times V_{OUT})$, with $V_{OUT}$ varying over time from 0V to its final steady-state value. Thus, at the beginning of start-up, $V_{DS}$ is at a high value and decreases over time as $V_{OUT}$ increases.

$I_{MAIN}$ is proportional to the pilot current $I_{PILOT}$. Controlling $I_{PILOT}$ to be inversely proportional to $V_{DS} \approx V_{IN}-(n \times V_{OUT})$ as $V_{OUT}$ varies over time allows the power through pFET Mp0 to be held approximately constant. Thus, at the beginning of start-up, $I_{PILOT}$ should be at a low value and increase over time as $V_{OUT}$ increases.

The time-varying value of the pilot current $I_{PILOT}$ could be set by the variable reference current circuit 322 as a direct function of the measured voltage $V_{FC1}$ across the fly capacitor $C_{F1}$ between nodes Cx and Px, since $V_{FC1}$ should be proportional to $V_{OUT}$; $I_{PILOT}$ would increase as $V_{FC1}$ increased. If the power converter includes more than one fly capacitor, then the pilot current $I_{PILOT}$ could be set by the variable reference current circuit 322 as a direct function of the measured voltage $V_{FCx}$ across a capacitor CFx, where $x \geq 1$, since $V_{FCx}$ should be proportional to $V_{OUT}$; $I_{PILOT}$ would increase as $V_{FCx}$ increased. Alternatively, the pilot current $I_{PILOT}$ could be set by the variable reference current circuit 322 as a direct function of the measured voltage $V_{OUT}$; $I_{PILOT}$ would increase as $V_{OUT}$ increased.

In some embodiments, there is no need to sense $V_{OUT}$ or $V_{FCx}$ directly. Rather, it is sufficient to predict or approximate the value of $V_{FCx}$ (or of $V_{OUT}$) over time based on foreknowledge of the steady-state values (post-startup) of $V_{IN}$, $V_{OUT}$, and the conversion ratio n for a particular power converter configuration. The time duration of the startup period can be estimated or determined by analysis of the power converter configuration (e.g., as a modeled circuit or as a physical instance, such as a test IC). With these known values and estimates, a variable reference current circuit 322 may be configured that provides a current $I_{PILOT}$ that increases as $V_{FCx}$ (or $V_{OUT}$) increases or as the $V_{DS}$ of pFET Mp0 decreases, thus offsetting decreases in the $V_{DS}$ of pFET Mp0 as $V_{FCx}$ (or $V_{OUT}$) increases. Accordingly, $P_{MAIN} \approx V_{DS} \times I_{MAIN}$ is approximately constant. As should be appreciated, there are many ways known in the art to generate a variable reference current.

Figure 4:
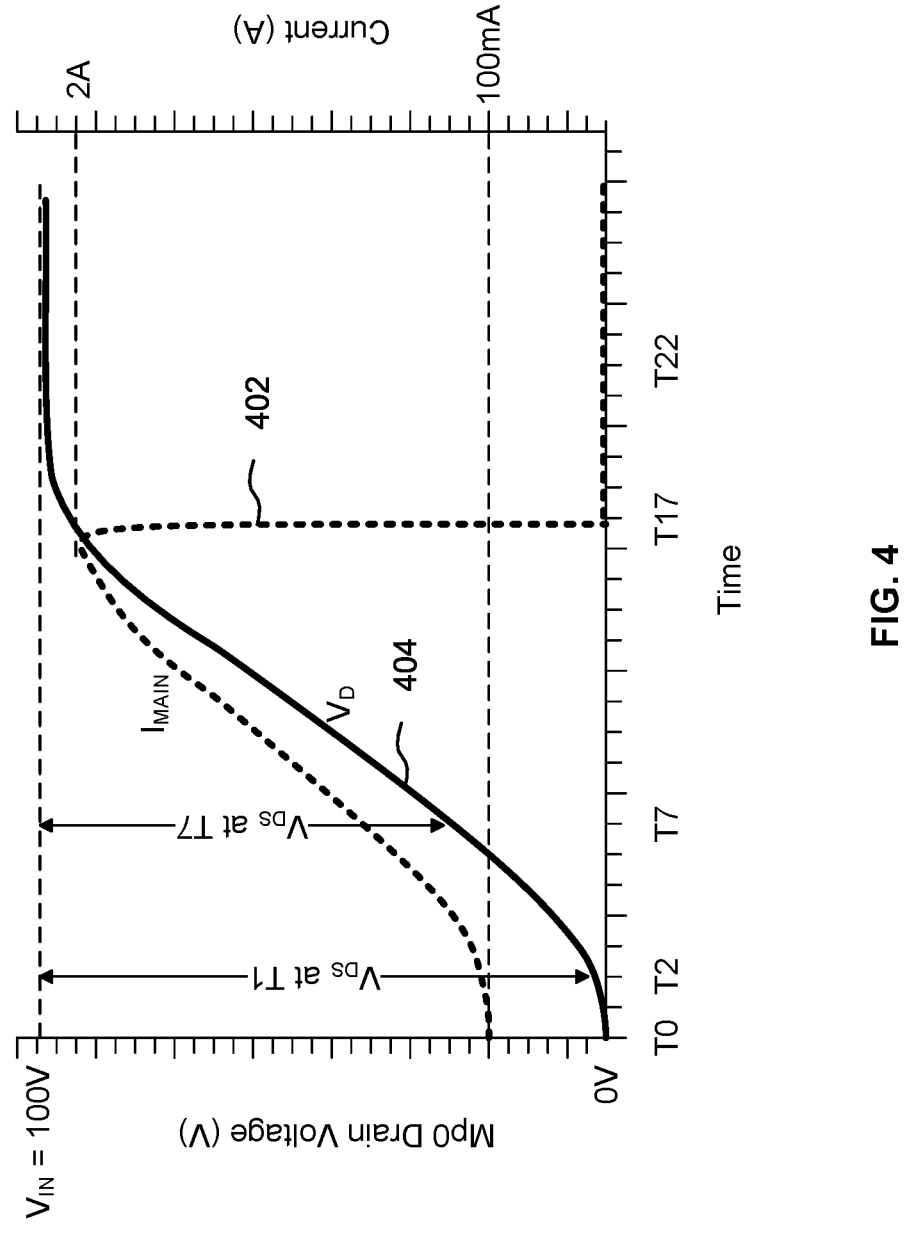
FIG. 4 is a graph of pFET Mp0 drain voltage $V_D$ (left axis) and $I_{MAIN}$ current (right axis) as a function of time for an example power converter.

FIG. 4 is a graph 400 of pFET Mp0 drain voltage $V_D$ (left axis) and $I_{MAIN}$ current (right axis) as a function of time for an example power converter. Graph line 402 represents $I_{MAIN}$ (proportional to $I_{PILOT}$) and graph line 404 represents $V_D$. Assuming $V_{IN}=100V$, $V_D$ starts at 0V at time T0 and increases to about 100V at time T22. The increase in $V_D$ reflects that fly capacitor $C_{F1}$ is charging and $V_{FC1}$ is increasing. In this example, $I_{MAIN}$ is set initially to be about 100 mA and increases to about 2 A as $V_D$ increases. At about time T17, the current applied to generate $I_{MAIN}$ may be dropped down to about OA since fly capacitor charge is within an allowable operational range. The arrows at times T2 and T7 show that $V_{DS}$ for pFET Mp0 decreases as $I_{MAIN}$ increases; accordingly, the power through pFET Mp0 is held to be approximately constant.

While the graph 402 in FIG. 4 depicts specific curves for the $I_{MAIN}$ current, it should be appreciated that other functions (e.g., stepped, linear, non-linear, etc.) may be used as alternatives for the underlying controlling current $I_{PILOT}$. For example, increases in $I_{PILOT}$ may be stepped rather than monotonic, $I_{PILOT}$ may start with an offset from zero, and the rate of change of $I_{PILOT}$ need not be uniform. In the case of a stepped function for $I_{PILOT}$, even as few as two steps may be sufficient. For example, $I_{PILOT}$ may be set at a first level of current (e.g., 10 mA) for a period of time, then set at a second level of current (e.g., 2 A) for a next period of time. Some embodiments may also take into account a measured rise in temperature of the power converter circuit in determining the value of $I_{PILOT}$. The principle is that $I_{PILOT}$ increases as $V_{FCx}$ (or $V_{OUT}$) increases sufficiently to approximately offset decreases in the $V_{DS}$ of pFET Mp0 as $V_{FCx}$ (or $V_{OUT}$) increases such that $P_{MAIN}$ does not significantly exceed the thermal operating limits of the power converter circuit, particularly as embodied in an IC. In a worst-case scenario, such as a short at the $V_{OUT}$ terminal, $V_{DS}$ may not decrease over time, and $I_{PILOT}$ would remain at its initial lowest value since $V_{FCx}$ (or $V_{OUT}$) would be not increasing.

Figure 5:
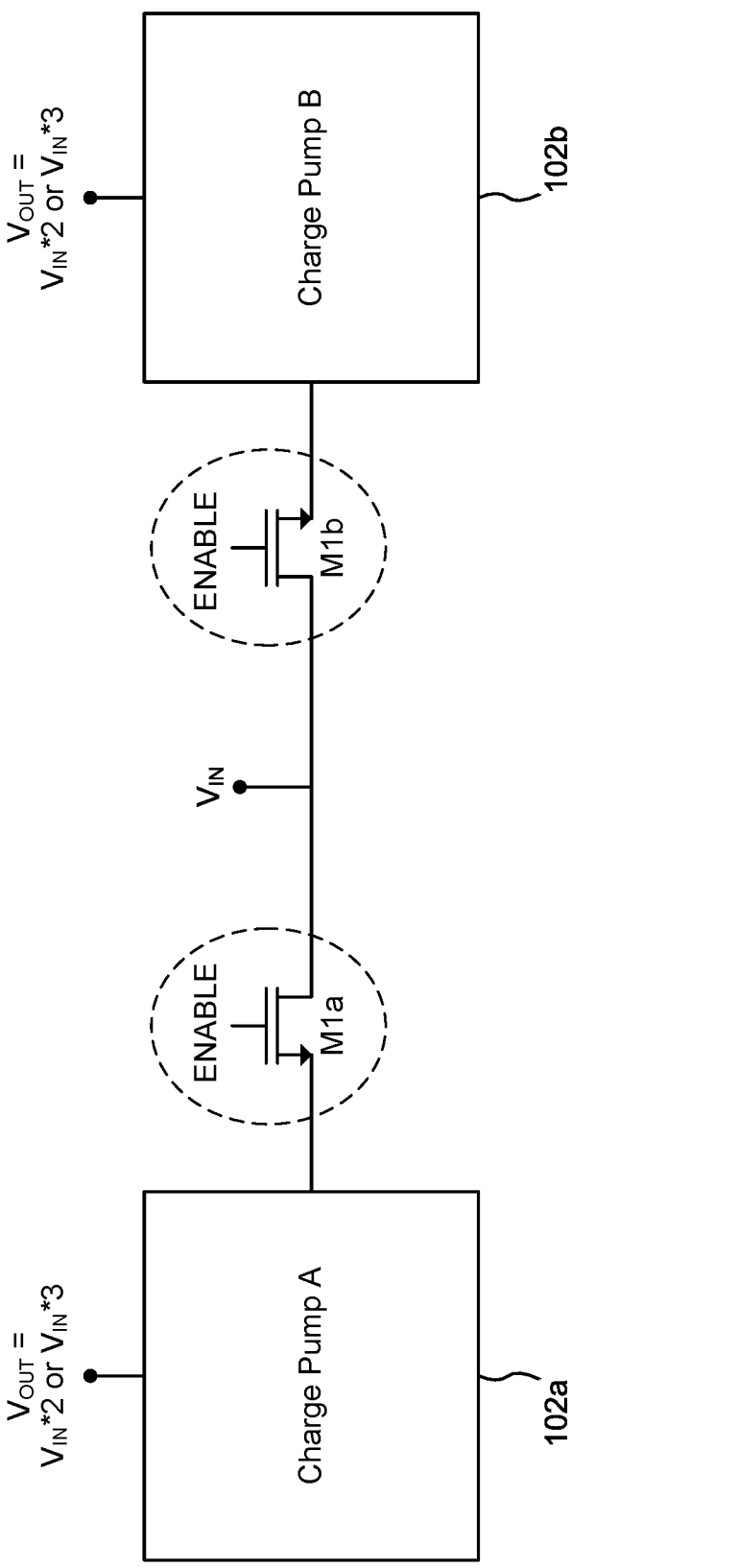
FIG. 5 is a schematic diagram of a selectable conversion ratio Dickson power converter in a step-up configuration.

As noted above, the GVD circuit 302 may be coupled to the gate of at least the initial FET within a power converter (or a section of the power converter) that is closest to the $V_{IN}$ input. Also as previously noted, some step-down power converters may be used as step-up power converters by reversing the voltage input and voltage output, possibly with some relatively minor design changes. For example, FIG. 5 is a schematic diagram of a selectable conversion ratio Dickson power converter 500 in a step-up configuration (note that in some embodiments, a change of conversion ratio may require cycling power to the converter)). Parallel sections 102a, 102b correspond to the similarly numbered sections in the step-down power converter of FIG. 1. The $V_{OUT}$ terminal of FIG. 1 has been relabeled as "$V_{IN}$", and the $V_{IN}$ terminal of FIG. 1 has been relabeled as "$V_{OUT}$" with two possible steady-state values listed for this example circuit, either $V_{OUT}=V_{IN} \times 2$ or $V_{OUT}=V_{IN} \times 3$.

Between the $V_{IN}$ terminal and each section 102a, 102b is a respective main switch M1a, M1b (which may or may not need to be a high-voltage switch, depending on the value of $V_{IN}$). The main switches M1a, M1b serve as the initial FETs to which a corresponding GVD circuit 302 would be coupled. If a main switch M1a, M1b is not used, then a GVD circuit 302 may be coupled to the gates of low-side switches within each section 102a, 102b (e.g., switches S5 in FIG. 1), to control current during soft-startup of the power converter 500.

While IC area considerations may suggest using a GVD circuit 302 to drive only an initial FET, it should be understood that that a GVD circuit 302 may be used to drive any other (including all) switches within a power converter. Doing so would distribute power consumption (heat) across more devices during startup, which may allow more total power to be applied to more quickly attain a steady-state operational status.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 6:
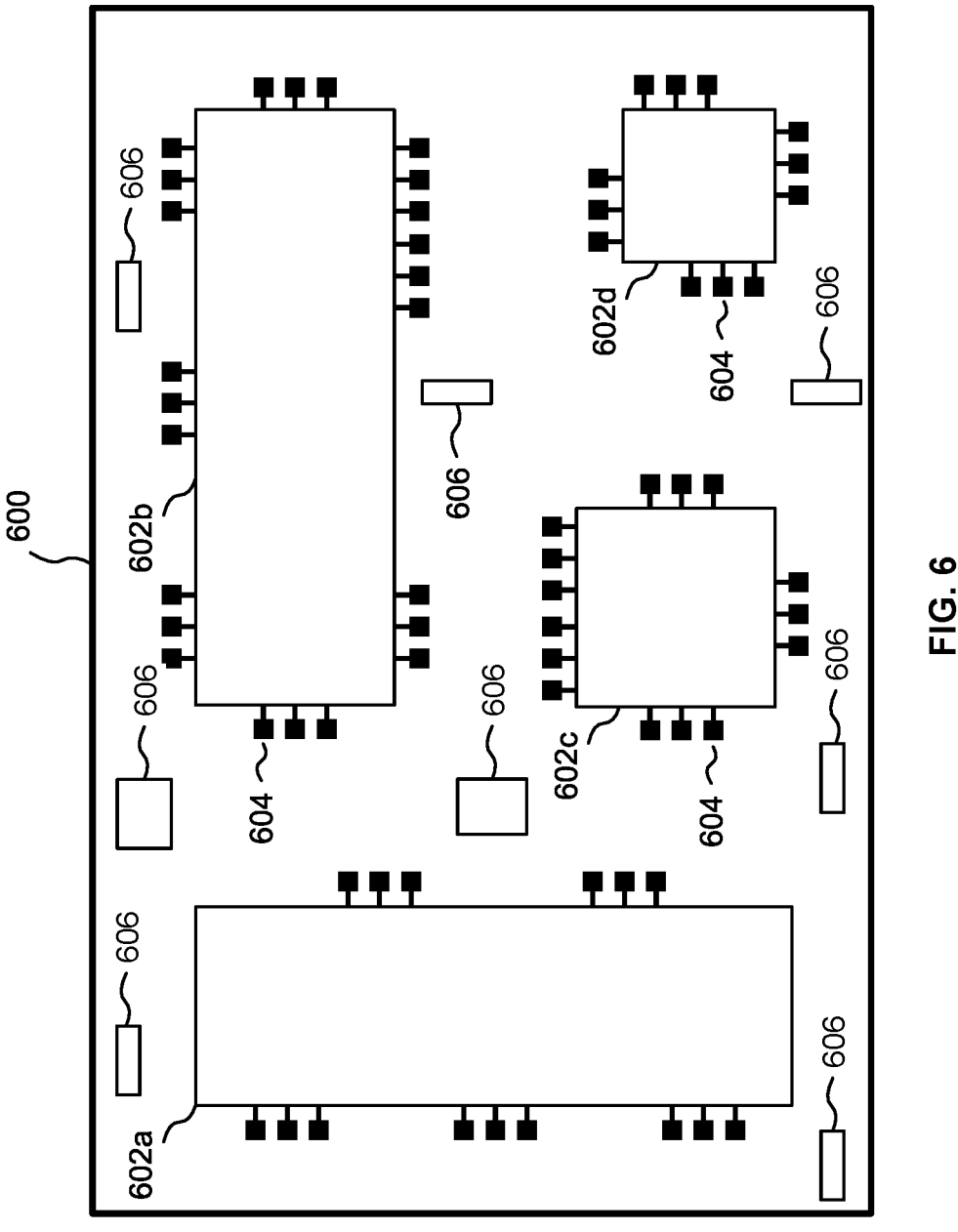
FIG. 6 is a top plan view of a substrate that may be, for example, a printed circuit board or chip module substrate (e.g., a thin-film tile).

As one example of further integration of embodiments of the present invention with other components, FIG. 6 is a top plan view of a substrate 600 that may be, for example, a printed circuit board or chip module substrate (e.g., a thin-film tile). In the illustrated example, the substrate 600 includes multiple ICs 602a-602d having terminal pads 604 which would be interconnected by conductive vias and/or traces on and/or within the substrate 600 or on the opposite (back) surface of the substrate 600 (to avoid clutter, the surface conductive traces are not shown and not all terminal pads are labelled). The ICs 602a-602d may embody, for example, signal switches, active and/or passive filters, amplifiers (including one or more LNAs), and other circuitry. For example, IC 602b may incorporate one or more instances of a power converter circuit in accordance with the teachings of this disclosure.

The substrate 600 may also include one or more passive devices 606 embedded in, formed on, and/or affixed to the substrate 600. While shown as generic rectangles, the passive devices 606 may be, for example, filters, capacitors, inductors, transmission lines, resistors, antennae elements, transducers (including, for example, MEMS-based transducers, such as accelerometers, gyroscopes, microphones, pressure sensors, etc.), batteries, etc., interconnected by conductive traces on or in the substrate 600 to other passive devices

606 and/or the individual ICs 602a-602d. The front or back surface of the substrate 600 may be used as a location for the formation of other structures.

Methods

Another aspect of the invention includes methods for maintaining approximately constant power through a transistor of a power converter during a time period of operation of the power converter. For example, a first method maintains approximately constant power through a transistor of a power converter during a time period of operation of the power converter by limiting current through the transistor to a value that is inversely proportional to a voltage across the transistor. As another example, a second method maintains approximately constant power through a FET of a power converter during a startup time period of operation of the power converter by limiting current through the FET to a value that is inversely proportional to a drain-to-source voltage $V_{DS}$ across the FET.

Additional aspects of the above method may include one or more of the following: wherein the limited current through the transistor is inversely proportional to $V_{IN}$–(n× $V_{OUT}$), where $V_{IN}$ is an input voltage to the power converter, $V_{OUT}$ is an output voltage of the power converter, and n is a conversion ratio of the power converter; and/or wherein the limited current through the transistor is proportional to one of $V_{OUT}$ or $V_{FCx}$, where $V_{OUT}$ is an output voltage of the power converter and $V_{FCx}$ is a voltage across a fly capacitor of the power converter.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies, such as bipolar junction transistors (BJTs), BICMOS, LDMOS, BCD, GaAs HBT, GaN HEMT, GaAs pHEMT, MESFET, InP HBT, InP HEMT, FinFET, GAAFET, and SiC-based device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHZ). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A driver circuit configured to maintain approximately constant power through a transistor of a power converter during a time period of operation of the power converter, the driver circuit comprising:

a variable reference current circuit configured to provide a first current that is inversely proportional to a voltage across the transistor; and a power limiting circuit coupled to the variable reference current circuit and to the transistor, wherein the power limiting circuit is configured to provide a control voltage to a control input of the transistor based on the first current to cause the transistor to pass a second current proportional to the first current in which the second current changes the voltage across the transistor such that power through the transistor is maintained approximately constant.

2. The driver circuit of claim 1, wherein the transistor of the power converter is a FET.

3. The driver circuit of claim 1, wherein the transistor of the power converter is a FET, and the voltage across the FET is a drain-to-source voltage $V_{DS}$.

4. The driver circuit of claim 1, wherein the power limiting circuit is configured to provide the control voltage to cause the transistor to pass the second current through the transistor during a startup period of the power converter.

5. The driver circuit of claim 1, wherein the power limiting circuit is configured to provide the control voltage to cause the transistor to pass the second current through the transistor during a soft-startup period of the power converter commencing from an OFF state of the power converter.

6. The driver circuit of claim 1, wherein the first current is inversely proportional to $V_{IN}-(n\times V_{OUT})$, where $V_{IN}$ is an input voltage to the power converter, $V_{OUT}$ is an output voltage of the power converter, and n is a conversion ratio of the power converter.

7. The driver circuit of claim 1, wherein the first current is proportional to one of $V_{OUT}$ or $V_{FCx}$, where $V_{OUT}$ is an output voltage of the power converter and $V_{FCx}$ is a voltage across a fly capacitor of the power converter.

8. The driver circuit of claim 1, wherein the second current is inversely proportional to $V_{IN}-(n\times V_{OUT})$, where $V_{IN}$ is an input voltage to the power converter, $V_{OUT}$ is an output voltage of the power converter, and n is a conversion ratio of the power converter.

9. The driver circuit of claim 1, wherein the second current is proportional to one of $V_{OUT}$ or $V_{FCx}$, where $V_{OUT}$ is an output voltage of the power converter and $V_{FCx}$ is a voltage across a fly capacitor of the power converter.

10. The driver circuit of claim 1, wherein the power limiting circuit includes:

a first FET having a conduction channel coupled between a gate of the transistor and a reference voltage;

a second FET having a conduction channel having a first terminal coupled to a voltage source and a second terminal coupled to a gate of the second FET; and a third FET having a gate coupled to a gate of the first FET and a conduction channel having a first terminal coupled to the second terminal of the second FET and a second terminal coupled to the gate of the third FET and to the variable reference current circuit.

11. The driver circuit of claim 1, wherein to maintain the power of the transistor approximately constant, in response to a decrease in the voltage across the transistor, the variable reference current circuit and the power limiting circuit are cooperatively configured to increase the second current.

12. A driver circuit configured to maintain approximately constant power through a transistor of a power converter, the driver circuit comprising:

a variable reference current circuit configured to provide a first current based on a voltage at a node of the power converter; and a power limiting circuit coupled to the variable reference current circuit and to the transistor, wherein the power limiting circuit is configured to provide a control voltage to a control input of the transistor based on the first current to cause the transistor to pass a second current proportional to the first current and inversely proportional to a voltage across the transistor in which the second current changes the voltage across the transistor such that power through the transistor is maintained approximately constant.

13. The driver circuit of claim 12, wherein the transistor of the power converter is a FET.

14. The driver circuit of claim 12, wherein the transistor of the power converter is a FET, and the voltage across the FET is a drain-to-source voltage $V_{DS}$.

15. The driver circuit of claim 12, wherein the power limiting circuit is configured to provide the control voltage to cause the transistor to pass the second current through the transistor during a startup period of the power converter.

16. The driver circuit of claim 12, wherein the power limiting circuit is configured to provide the control voltage to cause the transistor to pass the second current through the transistor during a soft-startup period of the power converter commencing from an OFF state of the power converter.

17. The driver circuit of claim 12, wherein the first current is inversely proportional to $V_{IN}-(n\times V_{OUT})$, where $V_{IN}$ is an input voltage to the power converter, $V_{OUT}$ is an output voltage of the power converter, and n is a conversion ratio of the power converter.

18. The driver circuit of claim 12, wherein the first current is proportional to one of $V_{OUT}$ or $V_{FCx}$, where $V_{OUT}$ is an output voltage of the power converter and $V_{FCx}$ is a voltage across a fly capacitor of the power converter.

19. The driver circuit of claim 12, wherein the second current is inversely proportional to $V_{IN}-(n\times V_{OUT})$, where $V_{IN}$ is an input voltage to the power converter, $V_{OUT}$ is an output voltage of the power converter, and n is a conversion ratio of the power converter.

20. The driver circuit of claim 12, wherein the second current is proportional to one of $V_{OUT}$ or $V_{FCx}$, where $V_{OUT}$ is an output voltage of the power converter and $V_{FCx}$ is a voltage across a fly capacitor of the power converter.

21. The driver circuit of claim 12, wherein the power limiting circuit includes:

a first FET having a conduction channel coupled between a gate of the transistor and a reference voltage;

a second FET having a conduction channel having a first terminal coupled to a voltage source and a second terminal coupled to a gate of the second FET; and a third FET having a gate coupled to a gate of the first FET and a conduction channel having a first terminal coupled to the second terminal of the second FET and a second terminal coupled to the gate of the third FET and to the variable reference current circuit.

22. The driver circuit of claim 12, wherein to maintain the power of the transistor approximately constant, in response to a decrease in the voltage across the transistor, the variable reference current circuit and the power limiting circuit are cooperatively configured to increase the second current.

* * * * *